(12) United States Patent
Kurfiss et al.

(10) Patent No.: US 8,212,327 B2
(45) Date of Patent: Jul. 3, 2012

(54) HIGH FILL-FACTOR LASER-TREATED SEMICONDUCTOR DEVICE ON BULK MATERIAL WITH SINGLE SIDE CONTACT SCHEME

(75) Inventors: Neal T. Kurfiss, Waltham, MA (US); James E. Carey, Waltham, MA (US); Xia Li, Beverly, MA (US)

(73) Assignee: SiOnyx, Inc., Beverly, MA (US)

( * ) Notice: Subject to any disclaimer, the term of this patent is extended or adjusted under 35 U.S.C. 154(b) by 0 days.

(21) Appl. No.: 12/853,172

(22) Filed: Aug. 9, 2010

(65) Prior Publication Data

US 2011/0042773 A1 Feb. 24, 2011

Related U.S. Application Data

(63) Continuation-in-part of application No. 12/399,827, filed on Mar. 6, 2009, now abandoned.

(60) Provisional application No. 61/034,313, filed on Mar. 6, 2008.

(30) Foreign Application Priority Data

Mar. 6, 2009 (WO) ............... PCT/US2009/036409

(51) Int. Cl.
| | |
|---|---|
| H01L 31/00 | (2006.01) |
| H01L 47/00 | (2006.01) |
| H01L 29/06 | (2006.01) |
| H01L 29/24 | (2006.01) |
| H01L 29/38 | (2006.01) |
| H01L 29/30 | (2006.01) |
| H01L 29/36 | (2006.01) |
| H01L 29/40 | (2006.01) |
| H01L 31/111 | (2006.01) |
| H01L 29/732 | (2006.01) |
| H01L 27/148 | (2006.01) |
| H01L 31/062 | (2006.01) |
| H01L 29/861 | (2006.01) |

(52) U.S. Cl. ..................... 257/443; 257/4; 257/6; 257/7; 257/46; 257/104; 257/105; 257/106; 257/109; 257/111; 257/112; 257/186; 257/199; 257/233; 257/292; 257/481; 257/482; 257/497; 257/498; 257/603; 257/604; 257/910; 257/E29.327; 257/E29.329; 257/E29.33; 257/E29.331; 257/E29.332; 257/E29.333; 257/E29.334; 257/E29.335; 257/E29.337; 257/E29.338; 257/E29.339; 257/E29.34; 257/E29.341; 257/E31.115

(58) Field of Classification Search .................. 257/4, 6, 257/7, 46, 104, 105, 106, 109, 111, 112, 257/186, 199, 233, 292, 481, 482, 497, 498, 257/603, 604, 910, E29.327, E29.329, E29.33, 257/E29.331, E29.332, E29.333, E29.334, 257/E29.335, E29.337, E29.338, E29.339, 257/E29.34, E29.341, E31.063, E31.115, 257/443

See application file for complete search history.

(56) References Cited

U.S. PATENT DOCUMENTS 3,922,571 A * 11/1975 Smith ........................... 327/530
(Continued)

FOREIGN PATENT DOCUMENTS
EP 1873840 A1 1/2008
(Continued)

OTHER PUBLICATIONS

International Search Report and Written Opinion of the International Searching Authority, Oct. 15, 2009, from related foreign application PCT/US2009/036408, International Filing Date Mar. 6, 2009.
(Continued)

*Primary Examiner* — Ida M Soward
(74) *Attorney, Agent, or Firm* — Thorpe North & Western LLP

(57) ABSTRACT

The present disclosure provides systems and methods for configuring and constructing a single photo detector or array of photo detectors with all fabrications circuitry on a single side of the device. Both the anode and the cathode contacts of the diode are placed on a single side, while a layer of laser treated semiconductor is placed on the opposite side for enhanced cost-effectiveness, photon detection, and fill factor.

29 Claims, 6 Drawing Sheets

U.S. PATENT DOCUMENTS

| | | | | |
|---|---|---|---|---|
| 4,017,887 | A * | 4/1977 | Davies et al. | 257/609 |
| 4,149,174 | A * | 4/1979 | Shannon | 257/29 |
| 4,201,450 | A | 5/1980 | Trapani | |
| 4,277,793 | A | 7/1981 | Webb | |
| 4,630,082 | A * | 12/1986 | Sakai | 257/598 |
| 4,777,490 | A * | 10/1988 | Sharma et al. | 343/754 |
| 4,965,784 | A | 10/1990 | Land et al. | |
| 5,021,854 | A * | 6/1991 | Huth | 257/438 |
| 5,208,822 | A * | 5/1993 | Haus et al. | 372/50.1 |
| 5,502,329 | A * | 3/1996 | Pezzani | 257/546 |
| 5,559,361 | A * | 9/1996 | Pezzani | 257/546 |
| 5,710,442 | A * | 1/1998 | Watanabe et al. | 257/107 |
| 5,773,820 | A | 6/1998 | Osajda et al. | |
| 5,781,392 | A * | 7/1998 | Clark | 361/111 |
| 5,859,446 | A * | 1/1999 | Nagasu et al. | 257/174 |
| 5,861,639 | A * | 1/1999 | Bernier | 257/157 |
| 5,923,071 | A * | 7/1999 | Saito | 257/458 |
| 6,252,256 | B1 * | 6/2001 | Ugge et al. | 257/111 |
| 6,429,036 | B1 | 8/2002 | Nixon et al. | |
| 6,504,178 | B2 * | 1/2003 | Carlson et al. | 257/86 |
| 6,639,253 | B2 * | 10/2003 | Duane et al. | 257/111 |
| 6,822,313 | B2 * | 11/2004 | Matsushita | 257/544 |
| 6,919,587 | B2 * | 7/2005 | Ballon et al. | 257/107 |
| 7,057,256 | B2 | 6/2006 | Carey, III et al. | |
| 7,354,792 | B2 | 4/2008 | Carey, III et al. | |
| 7,390,689 | B2 | 6/2008 | Mazur et al. | |
| 7,442,629 | B2 | 10/2008 | Mazur et al. | |
| 7,498,650 | B2 | 3/2009 | Lauxtermann | |
| 7,605,397 | B2 * | 10/2009 | Kindem et al. | 257/46 |
| 2002/0020893 | A1 * | 2/2002 | Lhorte | 257/481 |
| 2004/0041168 | A1 * | 3/2004 | Hembree et al. | 257/173 |
| 2004/0046224 | A1 * | 3/2004 | Rossel et al. | 257/471 |
| 2006/0097290 | A1 * | 5/2006 | Hietanen | 257/233 |
| 2006/0231914 | A1 | 10/2006 | Carey, III et al. | |
| 2008/0258604 | A1 | 10/2008 | Mazur et al. | |
| 2009/0038669 | A1 * | 2/2009 | Atanackovic | 136/244 |
| 2009/0227061 | A1 * | 9/2009 | Bateman et al. | 438/57 |
| 2010/0140733 | A1 | 6/2010 | Lee et al. | |

FOREIGN PATENT DOCUMENTS

| | | |
|---|---|---|
| JP | 2006173381 A | 6/2006 |
| JP | 2007165909 A | 6/2007 |
| WO | 2008091242 A2 | 7/2008 |

OTHER PUBLICATIONS

International Preliminary Report on Patentability of The International Bureau of WIPO, Sep. 16, 2010, from related foreign application PCT/US2009/036408, International Filinf Date Mar. 6, 2009.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al. "Femtosecond Laser-Assisted Microstructuring of Silicon for Novel Detector, Sensing and Display Technologies", LEOS 2002, 97-98, Glasgow, Scotland.

Carey, et al., "High Sensitivity Silicon-Based VIS/NIR Photodetectors", Optical Society of America (2003) 1-2.

Carey, et al. "Femtosecond Laser-Assisted Microstructuring of Silicon for Novel Detector, Sensing and Display Technologies", LEOS 2003, 481-482, Tuscon, AR.

Carey et al., "Femtosecond-Laser-Assisted Microstructuring of Silicon Surfaces", Optics and Photonics News, 2003. 14, 32-36.

Chien et al, "Pulse Width Effect in Ultrafast Laser Processing of Materials," Applied Physics A, 2005, 1257-1263, 81, Springer Berlin, Heidelberg, Germany.

Crouch et al., "Infrared Absorption by Sulfur-Doped Silicon Formed by Femtosecond Laser Irradiation", Appl. Phys. A, 2004, 79, 1635-1641.

Crouch et al., "Comparison of Structure and Properties of Femtosecond and Nanosecond Laser-Structured Silicon" Appl. Phys. Lett., 2004, 84,1850-1852.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Novel Conical Microstructures Created in Silicon With Femtosecond Laser Pulses", CLEO 1998, 511-512, San Francisco, CA.

Her et al., "Microstructuring of Silicon with Femtosecond Laser Pulses," Applied Physics Letters, 1998, 1673-1675, vol. 73, No. 12, American Institute of Physics.

Her, et al., "Femtosecond laser-induced formation of spikes on silicon," Applied Physics A, 2000, 70, 383-385.

Hu et al., "Solar Cells from Basic to Advanced Systems," McGraw Hill Book Co., 1983, 39, New York, New York.

Nayak et al, "Semiconductor Laser Crystallization of a-Si:H," SPIE Digital Library, 2003, 277-380, vol. 4977, Bellingham, Washington.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Ultrafast Laser Textured Silicon Solar Cells," Mater. Res. Soc. Symp. Proc., 2009, vol. 1123, Materials Research Society.

Pedraza et al., "Surface Nanostructuring of Silicon", Appl. Phys. A, 2003, 77, 277-284.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Serpengüzel et al., "Temperature Dependence of Photluminescence in Non-Crystalline Silicon", Photonics West (San Jose, CA, 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Younkin, "Surface Studies and Microstructure Fabrication Using Femtosecond Laser Pulses," Thesis presented to the Division of Engineering & Applied sciences at Harvard University (Aug. 2001).

Younkin et al., "Infrared Absorption by Conical Silicon Microstructures Made in a Variety of Background Gases Using Femtosecond-Laser Pulses", J. Appl. Phys., 93, 2626-2629 (2003).

Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

International Search Report and Written Opinion of the International Searching Authority, Oct. 15, 2009, from foreign application PCT/US09/036408, International Filing Date Mar. 6, 2009 (foreign counterpart to U.S. Appl. No. 12/252,101).

* cited by examiner

HIGH FILL-FACTOR LASER-TREATED SEMICONDUCTOR DEVICE ON BULK MATERIAL WITH SINGLE SIDE CONTACT SCHEME

I. RELATED APPLICATIONS

The present application claims the benefit of U.S. non-provisional application Ser. No. 12/399,827 filed on Mar. 6, 2009, which claims the benefit of U.S. provisional application No. 61/034,313 filed on Mar. 6, 2008 and both of which are hereby incorporated by reference in their entirety.

II. TECHNICAL FIELD

The present disclosure relates to enhanced absorption semiconductor diode structures and imagers. In particular, the present disclosure relates to laser-treated semiconductor diodes with single side electrical contact fabrication on silicon material.

III. BACKGROUND

Conventional silicon wafers require a substantial absorption depth for photons having wavelengths longer than approximately 500 nm. For example, conventional silicon wafers having standard wafer depth (less than approximately 750 μm) cannot absorb photons having wavelengths in excess of 1050 nm.

As such, designing pixels using conventional silicon requires a deep collection element for photons that have a wavelength greater than approximately 500 nm. If photons incident upon a surface of the wafer and traveling into its depth are absorbed in a region deeper than the effective field of these pixel elements, the absorbed photons can generate photoelectrons that wander (diffuse) to adjacent pixels causing cross talk and lower resolution. In photodetector arrays, and in applications using the same, this can result in a blurring effect and a loss of accuracy in spatially-dependent applications such as imaging equipment. Such wandering photoelectrons in field-free regions also have a high probability of recombining before pixel collection resulting in lower sensitivity and efficiency.

CMOS imaging circuit can be characterized by a "device fill factor," corresponding to the fraction of the overall chip area being effectively devoted to the pixel array, and a "pixel fill factor," corresponding to the effective area of a light sensitive photodiode relative to the area of the pixel that may be used to determine the amount of silicon that is photoactive. The device fill factor in conventional devices is less than unity (1.0) because, as described above, a notable portion of the device beneath the pixel array area cannot be used for processing.

Moreover, the pixel fill factor in conventional devices is typically substantially less than about 1.0 because, for example, bussing and addressing circuits are fabricated around the base substrate layers of a pixel. As such, the bussing and addressing circuits limit the amount of space available for photodetection circuitry. Such bussing and addressing circuitry also limit the acceptance cone angle for electrons directed towards an imaging array.

Imagers can be front side illumination (FSI) or back side illumination (BSI). There are advantages and disadvantages to both architectures. In a typical FSI imager, incident light enters the semiconductor by first passing by a transistor and metal circuitry. The light, however, scatters off of the transistors and circuitry prior to entering the light sensing portion of the imager, thus causing optical loss and noise. A lens can be disposed on the topside of a FSI pixel to direct and focus the incident light to the light sensing active region of the device, thus partially evading the circuitry. BSI allows for smaller pixel architecture and a high fill factor for the imager, by allowing the transistors and circuitry to be located on the opposite of the where the incident light enters the device. This increase in fill factor and reduction in light scatter increases efficiency.

IV. SUMMARY

The present disclosure provides radiation-absorbing semiconductor devices and associated methods of making and using such devices. In one aspect, for example, a photosensing device including a bulk semiconductor material having a first side and a second side is provided. The first side includes a first region that may be doped with a first dopant or alternatively, the first region can include a laser treated region that is formed within the first region. The laser treated region can be formed within the first region such that charge carriers are collected on the second side of the bulk semiconductor material. The laser treat region can be formed in the first region by a pulsed laser while simultaneously being doped with a first dopant. In some aspects, the laser treated region may be an enhanced absorption region. The enhanced absorption region maybe devoid of laser processing, however, the region may show improved absorption response. The photosensing device may further include a second region formed on the second side of the bulk semiconductor material and doped with a second dopant. Alternatively, multiple regions maybe formed and doped on the second side of the bulk semiconductor material. It is contemplated herein that a third region doped with a third dopant may be formed on the second side of the bulk semiconductor material. Ohmic contacts may further be included in the device. A first ohmic contact may be disposed on said second side and in contact with the second region such that the second region is electrically coupled with the laser treated portion thereby forming a diode. A second ohmic contact can be disposed on the second side and in electrical communication with the laser treated portion via the bulk semiconductor material. In addition, the laser treated portion can be disposed near a depletion region, wherein the depletion region is formed by the bulk semiconductor material and the second region. The electrical communication between the second ohmic contact and the laser treated region can be induced by an electrical field created within the bulk semiconductor material. Implementations of the device may include one or more of the following features. The device may include a passivation layer disposed on said first side, the second side, or both. The passivation layer may be selected from the group consisting of oxides, nitrides, metals and semiconductors. In some implementations, the bulk semiconductor material and the laser treated portion are doped with a p-type dopant. In other implementations, the bulk semiconductor material and the laser treated portion may be doped with an n-type dopant. In instances where the device has a third dopant region, the third dopant may be opposite in polarity of the second dopant.

The device may be operated at a bias of less than about 50V. In other implementations, the device may be operated at a bias of about 0V. The bulk semiconductor material may have a thickness of less than about 500 μm. In other implementations, the bulk semiconductor material has a thickness of less than about 50 μm. The laser treated portion may extend into the bulk semiconductor material to a depth of less than about 2 μm. In some implementations, the device may be disposed such that the first side is opposite of incident radiation such that radiation penetrates the second side prior to contacting the laser treated region.

An array of photosensing devices is also contemplated herein. The array may include a plurality of photosensing devices as described above. The plurality of photosensing devices may have a fill factor greater than about 90%. In addition the first sides of the plurality of photosensing devices are disposed to form a substantially planar top surface exposed to incident radiation. The top surface may have enhanced absorption regions, wherein the enhanced absorptions regions have a surface area that this greater than about 80% of the total top surface area.

In general, in another embodiment, a photosensing device may be provided. The photosensing device includes a bulk semiconductor material with a first and a second side, a laser treated region doped with a first dopant and disposed on the first side of the bulk semiconductor material, a first ohmic contact disposed on the second side of the bulk semiconductor material and in contact with a region doped with a second dopant, the region being electrically coupled with the laser treated region forming a diode, and a second ohmic contact disposed on the second side of the bulk semiconductor material in electrical communication with the laser treated region via the bulk semiconductor material.

Implementations of the device may include one or more of the following features. The device may include a feature wherein the bulk semiconductor material is comprised of silicon. The device may exhibit a quantum efficiency greater than 80% for light wavelengths longer than 900 nanometers and the device has a material thickness less than 500 microns. In other implementations, the device may exhibit a quantum efficiency greater than 80% for light wavelengths longer than 900 nanometers and the device has a material thickness less than 100 microns. In yet other implementations, the device may exhibit a quantum efficiency greater than 80% for light wavelengths longer than 900 nanometers and the device has a material thickness less than 50 microns. The device may exhibit an absorptance greater than 80% for light wavelengths longer than 800 nanometers and has a material thickness less than 100 microns. The device may further be disposed such that light radiation is directly incident on the laser treated region on the first side of the bulk semiconductor material.

In yet another aspect, a method of making a photosensing device includes the steps of providing a bulk semiconductor material; lasing the bulk semiconductor material; annealing at least a portion of the bulk semiconductor material and depositing a metal material on the bulk semiconductor material on the opposite side from the lased side. Alternatively, the method can provide steps that include providing a bulk semiconductor material; depositing a metal material on the bulk semiconductor material; lasing a side of the bulk semiconductor material that is devoid of the metal material; and annealing at least a portion of the bulk semiconductor material.

In some embodiments, some or all of the traditional fabrication steps are completed before the laser processing step, allowing the laser step to become the final or a late step in the process. By making the laser step the final or a late step in the process, it would be unnecessary to insert partially processed material into a fabrication house, thereby increasing the amount of potential fabrication houses available to produce laser treated semiconductor diodes.

In some embodiments, vertically stacking the laser treated semiconductor above a silicon integrated circuit in a back side illumination architecture provides a greater fill factor, in some embodiments almost or at 100% fill factor, and enables the laser processing step to be the final step or a late step since all or substantially all electrical contacts are located on the front side of the device and no or little additional back-side structure is required.

Various aspects of the present disclosure may provide one or more of the following advantages. The present disclosure may be applied to photodiodes, phototransistors, CCDs, and photovoltaic solar cells including thin film solar cells. In some embodiments, the single sided front side contacts in a back side illuminated architecture allows a black silicon surface on the back side of the device to be easily passivated. Passivation may reduce surface recombination of charge carriers. A non-compromised blue response and enhanced infrared response may be provided. A laser treated surface (i.e. enhanced absorption region) that is not fully depleted may be provided and hence dark current can be reduced. Improved gain and quantum efficiency may be provided. A smaller RC constant may be provided and hence a faster response time may be achieved. A longer effective absorption length for light may be provided due to the textured laser treated surface. Backside surface recombination may be minimized and hence external quantum efficiency increased through the addition of another doped implant region at the laser treated surface region. These and other advantages will be more fully understood after a review of the following figures, detailed description, and claims.

Other uses for the methods and apparatus given herein can be developed by those skilled in the art upon comprehending the present disclosure.

V. BRIEF DESCRIPTION OF THE DRAWINGS

Figure 4:
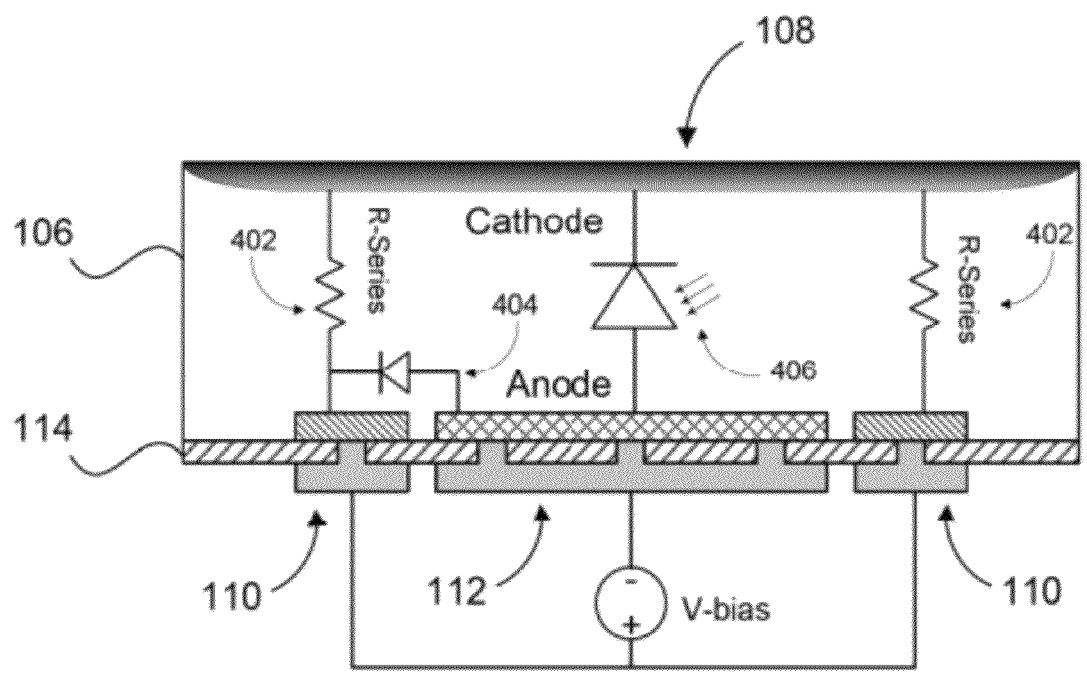
Figure 5:
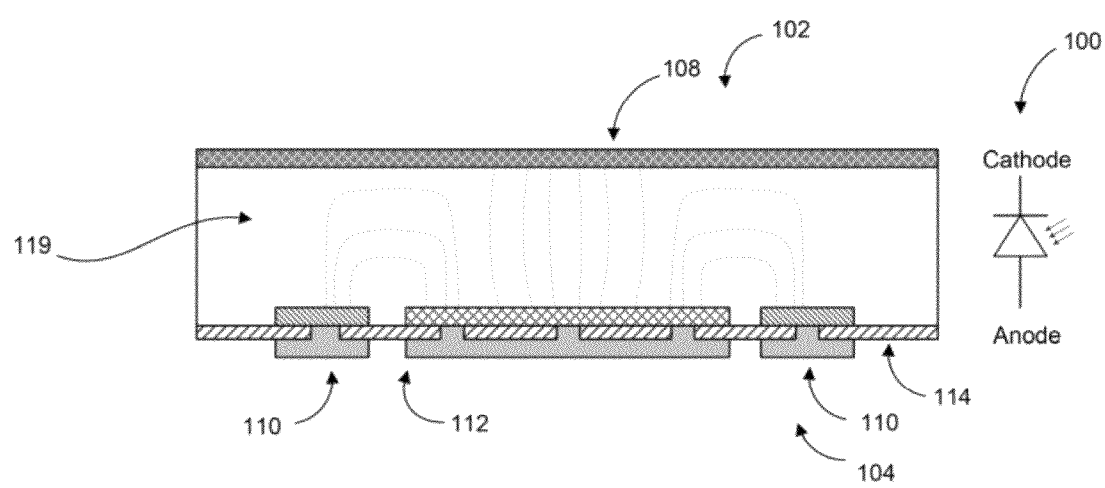

FIG. 4 illustrates a cross sectional area of an exemplary embodiment of a laser treated semiconductor diode with front-side metal contact pads including an exemplary circuit diagram approximation of the diode in operation; and FIG. 5 illustrates an exemplary diagram of the field lines in a cross sectional area during operation of a laser treated semiconductor diode with front side metal contact pads.

Figure 6:
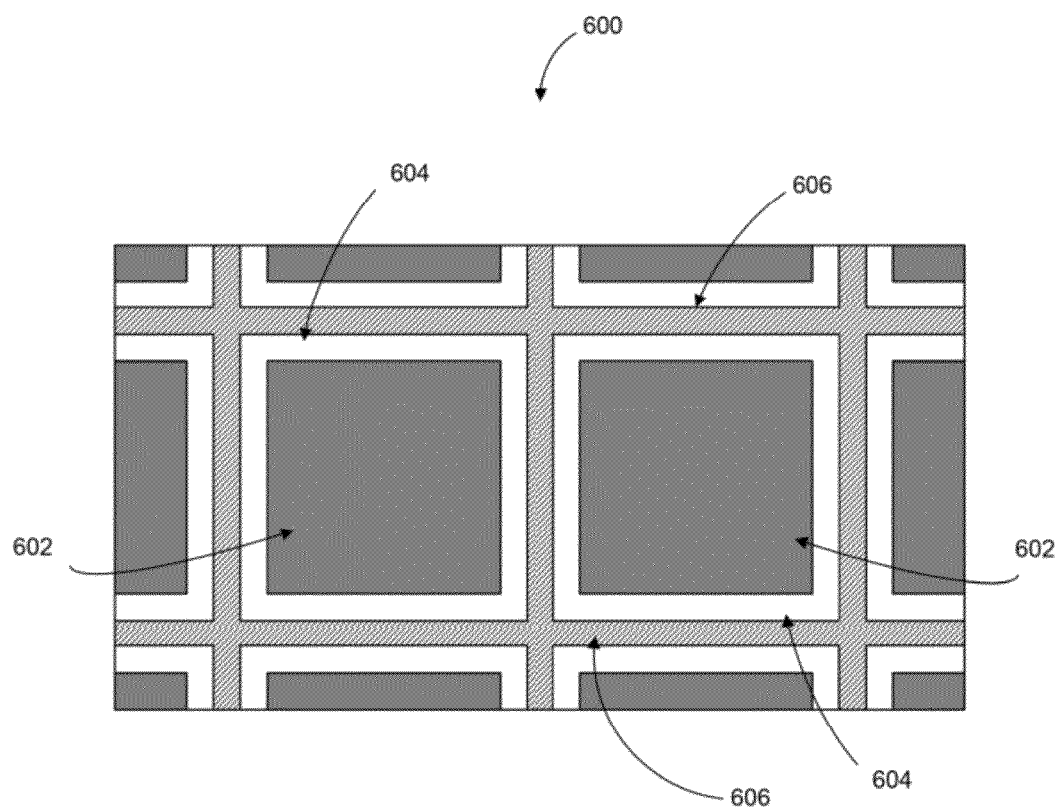

FIG. 6 illustrates an exemplary array of laser treated semiconductor diodes.

VI. DETAILED DESCRIPTION

In most of the disclosed embodiments, the photosensing diode contains a textured surface that is a laser-treated or processed region. The laser-treated region can improve the photo sensitivity of the device, enabling it to detect light having wavelengths from 200 nm-30 μm. This technology was developed and patented by Eric Mazur and James Carey, which can be found in U.S. Pat. Nos. 7,390,689; 7,057,256; 7,354,792; 7,442,629 which are incorporated by reference in their entirety. This technology has been coined the term of "Black Silicon."

In general, multiple steps are needed for combination designs (i.e. include electrical contacts on both sides of the substrate) which require additional lithography steps following the laser step to place contacts on the top-side. The top side is generally the side of a photo-responsive semiconductor device that is exposed to a source of light or electromagnetic radiation of interest, for example in a sensor or detector device. Thus, it is also called the "front side." The additional lithography following the laser step limits the number of fabrication houses that can produce laser treated semiconductor diodes, because many fabrication houses do not allow re-entry of partially processed material. In many cases, the company that performs the lithography is a different company than the company that performs the laser step and the steps are performed at separate locations. The feature of placing both the anode and cathode contacts on a single side opposite a laser treated surface alleviates the above mentioned manufacturing concerns. The configuration presented in the disclosure below permits performing a laser treatment step with associated annealing step prior to the lithography steps. In other embodiments, the ability may be provided to fully fabricate a device (i.e. perform lithography step) on bulk material leaving the laser treatment step for the end.

In addition, fill factor is an important parameter in area array image detector performance. Combination designs by their very nature require that contacts be placed on the top or front side of the detector, taking up space that could be used by the laser treated semiconductor layer for photon detection thereby reducing fill factor. In some embodiments, a device may be provided with a fill factor of greater than 90%.

Figure 1:
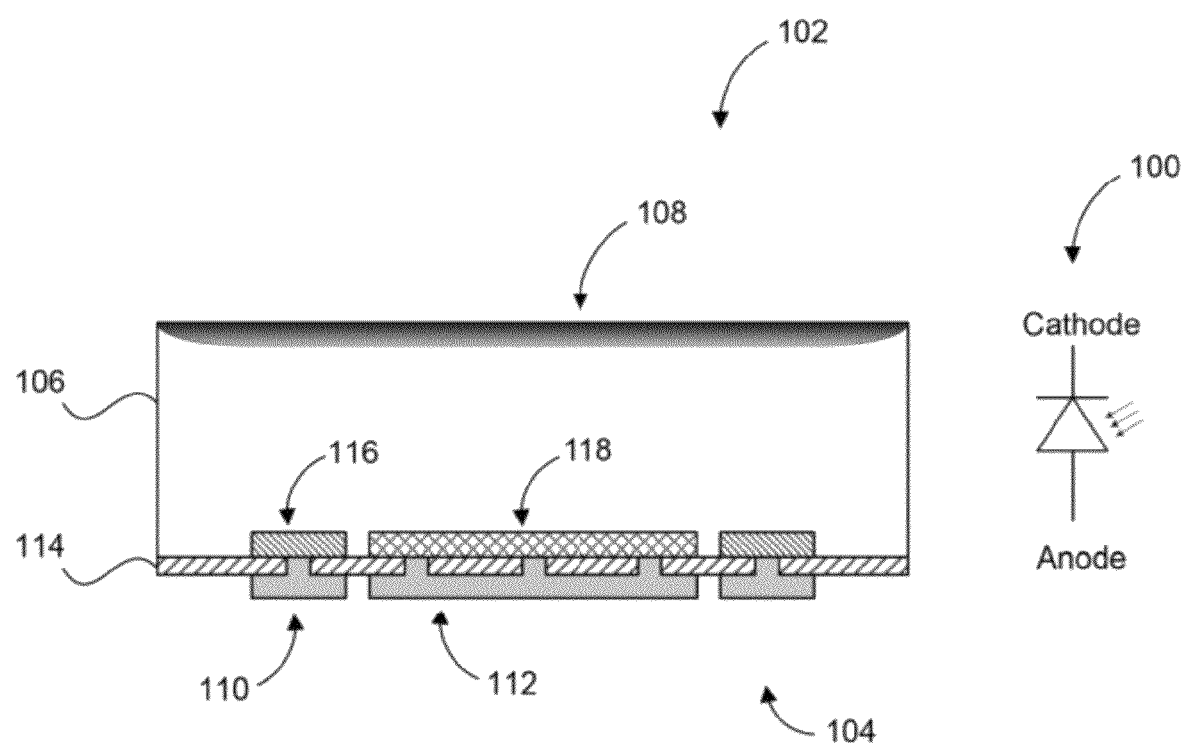
FIG. 1 illustrates a cross sectional area of an exemplary embodiment of a laser treated semiconductor diode with front-side metal contact pads.

FIG. 1 illustrates a cross sectional area of an exemplary embodiment of a laser treated semiconductor diode 100 with front-side metal contact pads 110 and 112. In the exemplary embodiment, the laser treated semiconductor diode 100 is an N-type diode, though persons skilled in the art will recognize that the diode 100 may be with other types (such as P-type, Schottky diodes, etc.). The exemplary laser treated semiconductor diode 100 has a back 102 and a front 104 side. The exemplary laser treated semiconductor diode 100 is arranged and disposed for back side illumination wherein the radiation is directly incident on the back side 102. In some embodiments the exemplary laser treated semiconductor diode 100 may be arranged and disposed for front side illumination wherein the radiation is directly incident on the front side 104. The exemplary laser treated semiconductor diode 100 contains a bulk layer of silicon 106 between the back 102 and the front 104 sides. In one embodiment, the bulk layer of silicon 106 may be less than 500 µm in thickness. In another embodiment, the bulk layer of silicon 106 may be less than 100 µm in thickness. In yet another embodiment the bulk layer of silicon 106 may be less than 50 µm in thickness. The bulk layer 106 may be doped with N-type doping, depending on the doping of the laser treated layer 108. In the exemplary embodiment, the back 102 side is covered by a laser treated semiconductor layer 108 and connected to the bulk layer 106. The laser treated semiconductor layer 108 may, in some embodiments, extend into the bulk semiconductor material to a depth of less than about 2 µm. The laser treated semiconductor layer 108 is photo active and has an increased sensitivity as compared to an undoped, untreated layer. In some embodiments, the laser treated semiconductor layer 108 may be referred to as an enhanced absorption region. In some embodiments, the laser treated semiconductor layer 108 may not cover the entire back 102 side of the semiconductor diode 100. In the instance where the laser treated semiconductor layer 108 does not cover the entire back 102 side, there may be a non-enhanced absorption region. In some embodiments, the enhanced absorption region may have an area that is greater than 80% of the back 102 side of the semiconductor diode 100. In another embodiment, the laser treated semiconductor layer 108 may be disposed on the front side 104 of the device. In some embodiments, the laser treated semiconductor diode 100 may include a passivation layer disposed on top of the laser treated semiconductor layer 108. In other embodiments, a passivation layer may be disposed on the front side 104 of the device. The passivation layer may be formed from oxides, nitrides, metals, or semiconductors. The front 104 side may be connected to aluminum cathode 110 and anode 112 contacts and may be covered by a thin layer of SiO2 TEOS 114. In some embodiments, the with front-side metal contact pads 110 and 112, may be constructed from appropriate metal materials that can withstand annealing temperatures of at least 450 degrees C. In other embodiments, the metal contact pads 110 and 112 may be placed on the back side 102. The front 104 side may also be doped using N-Type dopants 116 under the cathode contact 110 and P-type dopants 118 under the anode contact 112. In some embodiments, the N-Type dopant may be sulfur. In other embodiments, there may additional types of dopant regions on the front 104 side of the laser treated semiconductor diode 100. In embodiments where there are more than one type of dopant regions on the front 104 side of the laser treated semiconductor diode 100, at least two of the dopant regions may be opposite in polarity to each other. In the present embodiment of FIG. 1, the laser treated semiconductor layer 108 on the back 102 side acts as a cathode, while the front 104 side P-type doped section 118 acts as an anode. Additionally, an embodiment is contemplated wherein the laser treated semiconductor diode 100 is devoid of ohmic contacts 110 and 112. In some embodiments, the exemplary laser treated semiconductor diode 100 may exhibit a quantum efficiency of greater than 80% for radiation wavelengths longer than 900 nanometers. The quantum efficiency of greater than 80% for radiation wavelengths longer than 900 nanometers may be achieved in some embodiments where the laser treated semiconductor diode 100, has a material thickness less than 100 microns. In other embodiments, the quantum efficiency of greater than 80% for radiation wavelengths longer than 900 nanometers may be achieved where the laser treated semiconductor diode 100 has a material thickness less than 50 microns. In addition, the exemplary laser treated semiconductor diode 100 may exhibit an absorptance greater than 80% for light wavelengths longer than 800 nanometers where the laser treated semiconductor diode 100 has a material thickness less than 100 microns.

Figure 2:
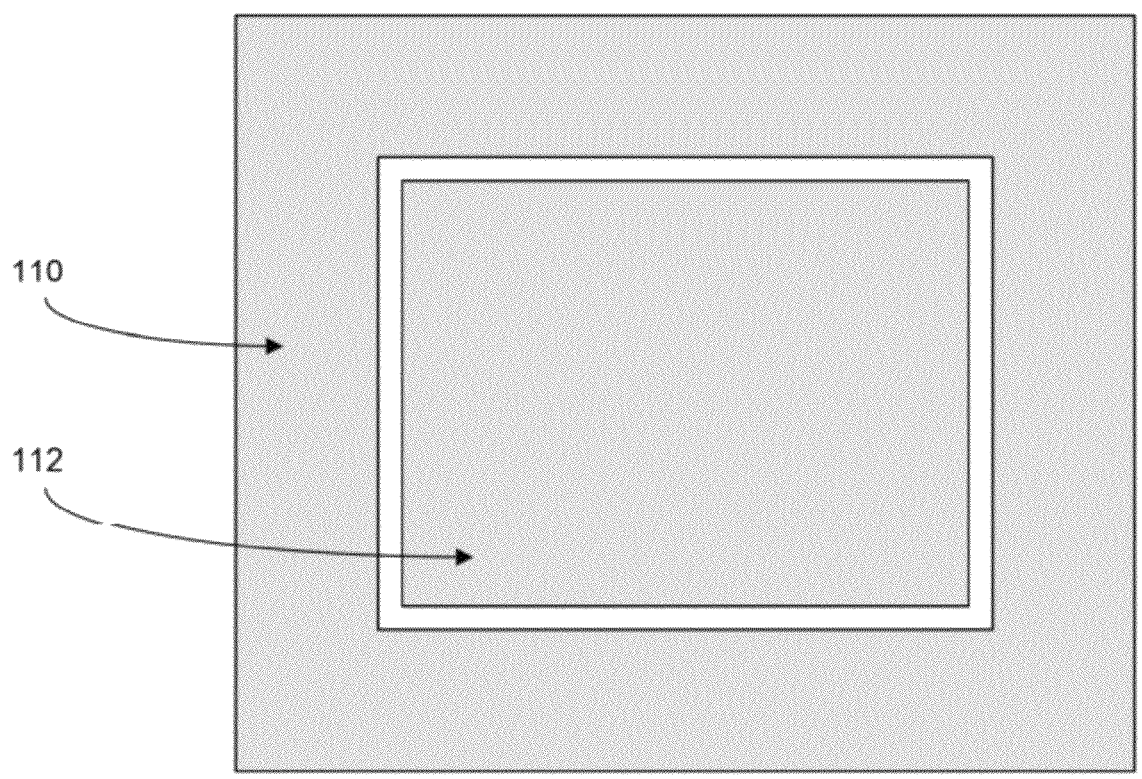
FIG. 2 illustrates a front view of a laser treated semiconductor diode with front-side metal contact pads.

FIG. 2 illustrates a front view of a laser treated semiconductor diode 100 with front-side metal contact pads 110 and 112. In the exemplary embodiment, aluminum contacts 110 and 112 are coupled to the back side 104. The outer contact 110 is coupled to the N-type doping area of the back side 102 and acts as a cathode contact point for the diode 100. The inner contact 112 is connected to the P-type doping area of the front 104 side and acts as an anode contact point for the diode 100. Each of the bounded regions (e.g., 112) in an array of such regions can act as a discrete pixel. For example, the regions 112 can each represent a pixel providing a color-sensing element in a color imager or a magnitude-sensing element in a monochromatic or gray-scale imager. In the exemplary embodiment, the anode contact 112 is electrically isolated from the cathode contact 110. A diode using a front side contact configuration allows for single sided fabrication, reducing cost and reducing complexity of manufacture. Also, a diode using a front side contact configuration may be substantially fully fabricated before the laser step process is performed on the back side. Fabrication before the laser step removes the need to re-enter the material into the foundry after the laser step, eliminating the contamination risk typically associated with the re-entry of partially processed material and increasing the number of available fabrication partners. Also, a diode using a front side contact configuration may be laser processed and annealed prior to electrical contact fabrication, thus eliminating the risk of the annealing process affecting the electrical contacts.

Figure 3:
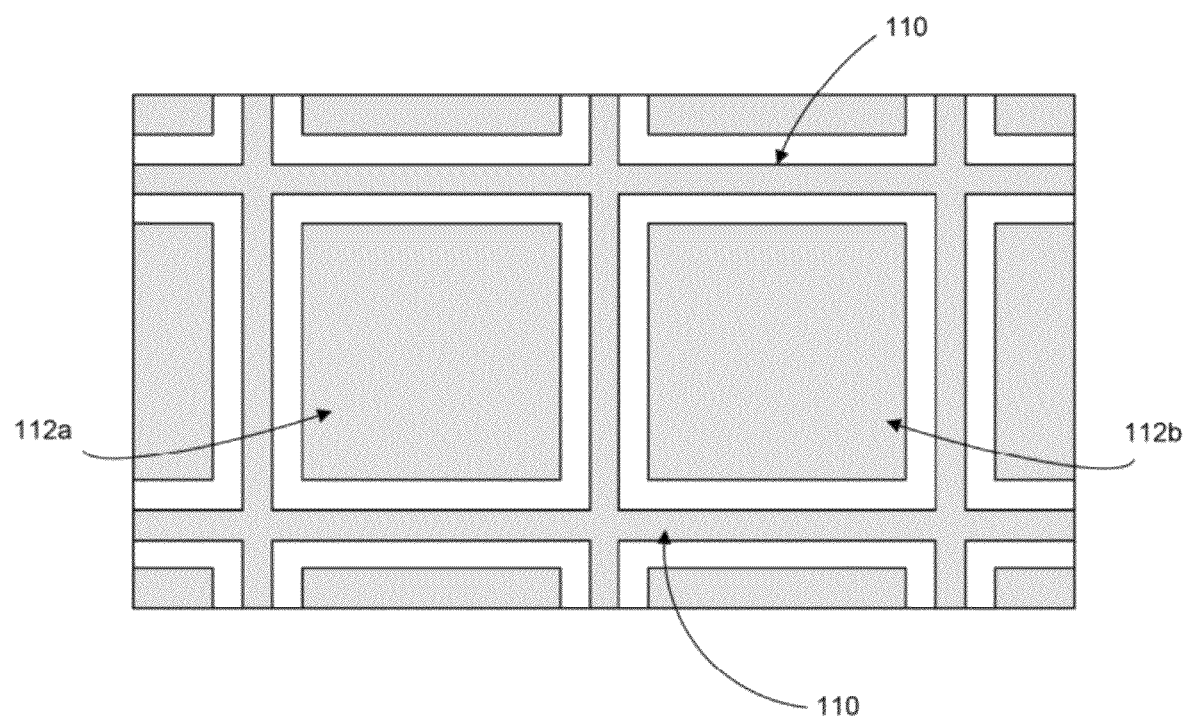
FIG. 3 illustrates an exemplary array of laser treated semiconductor diodes with front-side metal contact pads.

FIG. 3 illustrates an exemplary array of laser treated semiconductor diodes with front-side metal contact pads. In the exemplary embodiment, the cathode contacts 110 are all electrically connected and form a common-cathode configuration. In the exemplary embodiment, the cathode and anode connections are arranged in a grid pattern where the cathode contact 110 is configured in a square grid pattern and the anode contacts 112a and 112b are configured as individual square contacts within the cathode grid pattern 110. An array using the above configuration may be vertically bonded to readout circuitry and create a fully functional imager.

FIG. 4 illustrates a cross sectional area of an exemplary embodiment of a laser treated semiconductor diode with front-side metal contact pads including an exemplary circuit diagram approximation of the diode in operation. During operation, the cathode contact 110 may be positively biased in relation to the anode contact 112. The bias voltage ("V-bias") can be about 1 to 10 volts in some embodiments. In some embodiments the bias voltage can be less than about 5 volts. In other embodiments the bias voltage can be 0 volts. In some embodiments, the required bias voltage is substantially less than that in corresponding conventional devices. When the cathode is sufficiently positively biased, it will create an electric field that extends through the bulk layer 106 to the laser treated semiconductor layer 108 on the back 102 side, attracting the mobile electrons and depleting the laser treated semiconductor layer 108. The anode contact 112 may be held negative with respect to the cathode contact 110 and the laser treated semiconductor layer 108. During operation, the bulk layer 106 may be modeled as a series resistance 402 between the cathode contact 110 and the laser treated semiconductor layer 108. While the electric field generated between the anode and the cathode by their P-N junction 404 has a small relative volume, the field generated by the P-N junction 406 between the laser treated semiconductor layer 108 and the anode contact 112 has a larger, or even significantly larger volume. Therefore, electron hole/pairs generated by photon absorption at or near the laser treated semiconductor layer 108 are separated in this field. The electrons travel to the cathode contact 110 through the laser treated semiconductor layer 108, while the holes travel to the anode contact 112 through the field established by the P-N junction 406 between the laser treated semiconductor layer 108 and the anode contact 112.

While the exemplary diode shown was a P-N junction type diode, many other diode types may be implemented as discussed above, including Schottky diodes and P-type implementations. The p-type implementation may be implemented by reversing the dopant type throughout the diode and reversing the bias applied to the diode during use. The P-type implementation will function similarly to the N-type implementation except that the electron and hole flow paths will reverse direction.

FIG. 5 illustrates an exemplary diagram of the field lines 119, in a cross sectional area during operation of a laser treated semiconductor diode with front-side metal contact pads. Each field line represents a contour of equal voltage, or representing lines of equipotential. A tighter spacing of field lines indicates a stronger electromagnetic field. In semiconductors, a depletion region is often described as an area within the semiconductor in which mobile charge carriers have diffused away, or have been forced away by an electric field. Thus, the electric field lines 119 may form depletion regions near the laser treated semiconductor layer 108 sufficient for charge carriers from the laser treated semiconductor layer 108 to be swept away from the laser treated semiconductor layer 108 to collect at the contact 112.

FIG. 6 illustrates an exemplary array of laser treated semiconductor diodes 600 which collectively form an imager. The back sides of the laser treated semiconductor diodes are disposed to form a planar top surface of the array 600 which is to be exposed to incident radiation. The laser treated semiconductor diodes are photosensing devices which have a fill factor of greater than about 90%. The imaging array includes a laser treated portion 602, a non-laser treated portion 604, and trench isolation 606. The laser treated portion 602 may also be referred to as an enhanced absorbing region. The non-laser treated portion 604 of the semiconductor material may still be an active absorbing region, but it is not considered an enhanced absorbing region. The trench isolation 606 helps prevent electrical current leakage and electrical and/or optical crosstalk between adjacent semiconductor diodes in the imaging array. In some embodiments the enhanced absorption region 602 may have an area that is greater than 70% of the total imaging area which includes the enhanced absorption region 602 as well as the non-enhanced absorbing region 604, but not the trench isolation area 606. In other embodiments, the enhanced absorption region 602 may have an area that is greater than 80% of the total imaging area. In yet other embodiments, the enhanced absorption region 602 may have an area that is greater than 90% of the total imaging area.

What is claimed is:

1. A photosensing device, comprising
   a bulk semiconductor material having a first side and a second side;
   a first region doped with a first dopant and disposed on said first side;
   a second region doped with a second dopant and disposed on said second side;
   a laser treated portion formed within said first region such that charge carriers generated are collected on the second side of the bulk semiconductor material;
   a first contact disposed on said second side and in contact with said second region, the second region being in electrical communication with the laser treated portion; and
   a second contact disposed on said second side and in electrical communication with said laser treated portion via the bulk semiconductor material.

2. The photosensing device of claim 1, wherein the laser treated portion is formed near a depletion region.

3. The photosensing device of claim 1, further comprising a third region doped with a third dopant and disposed on said second side of the bulk semiconductor material.

4. The photosensing device of claim 1, wherein the laser treated portion is doped with said first dopant.

5. The photosensing device of claim 1, wherein the bulk semiconductor material is comprised of silicon.

6. The photosensing device of claim 1, further comprising a passivation layer disposed on said first side.

7. The photosensing device of claim 1, further comprising a passivation layer disposed on said second side.

8. The photosensing device of claim 6, wherein said passivation layer is selected from the group consisting of oxides, nitrides, metals and semiconductors.

9. The photosensing device of claim 1, wherein the bulk semiconductor material and said laser treated portion are doped with a p-type dopant.

10. The photosensing device of claim 1, wherein the bulk semiconductor material and said laser treated portion are doped with an n-type dopant.

11. The photosensing device of claim 3, wherein the third dopant is opposite in polarity of the second dopant.

12. The photosensing device of claim 1, wherein the device is operated at a bias of less than about 5V.

13. The photosensing device of claim 1, wherein the device is operated at a bias of about 0V.

14. The photosensing device of claim 1, wherein the bulk semiconductor material has a thickness of less than about 500 µm.

15. The photo sensing device of claim 1, wherein the bulk semiconductor material has a thickness of less than about 50 µm.

16. The photosensing device of claim 1, wherein the laser treated portion extends into the bulk semiconductor material to a depth of less than about 2 µm.

17. A photosensing array comprising, a plurality of photosensing devices as in claim 1.

18. The photosensing array of claim 17, wherein the plurality of photosensing devices have a fill factor greater than about 90%.

19. The photosensing array of claim 17, wherein the first sides of the plurality of photosensing devices are disposed to form a substantially planar top surface exposed to incident radiation.

20. The photosensing array of claim 19, wherein the top surface has enhanced absorption regions, wherein the enhanced absorption regions have a surface area that is greater than about 80% of the total top surface area.

21. The device of claim 1, wherein the first side is opposite of incident radiation such that radiation penetrates the second side prior to contacting the laser treated region.

22. A photosensing device, comprising:
a bulk semiconductor material with a first and a second side;
a laser treated region doped with a first dopant and disposed on the first side of the bulk semiconductor material;
a first ohmic contact disposed on the second side of the bulk semiconductor material and in contact with a region doped with a second dopant, the region being electrically coupled with the laser treated region; and
a second ohmic contact disposed on the second side of the bulk semiconductor material in electrical communication with the laser treated region via the bulk semiconductor material.

23. The device of claim 22, wherein the bulk semiconductor material is comprised of silicon.

24. The device of claim 22, wherein the device exhibits a quantum efficiency greater than 80% for light wavelengths longer than 900 nanometers and the device has a material thickness less than 500 microns.

25. The device of claim 22, wherein the device exhibits a quantum efficiency greater than 80% for light wavelengths longer than 900 nanometers and the device has a material thickness less than 100 microns.

26. The device of claim 22, wherein the device exhibits a quantum efficiency greater than 80% for light wavelengths longer than 900 nanometers and the device has a material thickness less than 50 microns.

27. The device of claim 22, wherein the device exhibits an absorbance greater than 80% for light wavelengths longer than 800 nanometers and has a material thickness less than 100 microns.

28. The device of claim 22, wherein the device is disposed such that light radiation is directly incident on the laser treated region on the first side of the bulk semiconductor material.

29. The device of claim 22, wherein the region doped with a second dopant is electrically coupled with the laser treated region thereby forming a diode.

* * * * *